(12) United States Patent
Nakada et al.

(10) Patent No.: US 11,251,105 B2
(45) Date of Patent: Feb. 15, 2022

(54) SEMICONDUCTOR DEVICE

(71) Applicant: Mitsubishi Electric Corporation, Tokyo (JP)

(72) Inventors: Katsushi Nakada, Tokyo (JP); Hiroki Shiota, Tokyo (JP); Masakazu Tani, Tokyo (JP); Yoshitaka Miyaji, Tokyo (JP); Mao Sawakawa, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/083,460

(22) Filed: Oct. 29, 2020

(65) Prior Publication Data

US 2021/0398873 A1 Dec. 23, 2021

(30) Foreign Application Priority Data

Jun. 18, 2020 (JP) .............................. JP2020-105034

(51) Int. Cl.
*H01L 23/367* (2006.01)
*H01L 23/552* (2006.01)
(Continued)

(52) U.S. Cl.
CPC ........ *H01L 23/3675* (2013.01); *H01L 23/552* (2013.01); *H01L 24/73* (2013.01);
(Continued)

(58) Field of Classification Search
CPC .............. H01L 23/3675; H01L 23/552; H01L 23/3107; H01L 24/73; H01L 2224/73265; H01L 2924/10272
See application file for complete search history.

(56) References Cited

U.S. PATENT DOCUMENTS 4,266,239 A * 5/1981 Miyagaki .............. H01L 23/057
257/664
5,365,107 A 11/1994 Kuraishi et al.
(Continued)

FOREIGN PATENT DOCUMENTS

JP 6-97321 A 4/1994
JP 2009-212302 A 9/2009
(Continued)

OTHER PUBLICATIONS

Communication dated Aug. 31, 2021, issued by the Japanese Patent Office in application No. 2020-105034.

*Primary Examiner* — Peniel M Gumedzoe
(74) *Attorney, Agent, or Firm* — Sughrue Mion, PLLC; Richard C. Turner

(57) ABSTRACT

The semiconductor device includes: a semiconductor module including a plate-shaped semiconductor element, a conductor electrically connected to one surface of the semiconductor element, a heat dissipation plate of which one surface is thermally and electrically connected to another surface of the semiconductor element, a resin member sealing the semiconductor element, the conductor, and the heat dissipation plate, and an insulation heat dissipation member thermally connected to another surface of the heat dissipation plate exposed from the resin member; a heatsink thermally connected to the insulation heat dissipation member; and an electric field inhibiting plate including a plate-shaped thin part covering the one surface of the semiconductor element and opposed thereto so as to be separated therefrom, the thin part being sealed by the resin member, and a connection part extending from the thin part to the heatsink and thermally and electrically connected to the heatsink.

8 Claims, 6 Drawing Sheets

(51) Int. Cl.
*H01L 23/00* (2006.01)
*H01L 23/31* (2006.01)

(52) U.S. Cl.
CPC ............... *H01L 23/3107* (2013.01); *H01L 2224/73265* (2013.01); *H01L 2924/10272* (2013.01)

(56) References Cited

U.S. PATENT DOCUMENTS

2009/0224398 A1   9/2009  Noritake et al.
2016/0233137 A1*  8/2016  Kawaguchi ............. H01L 23/24
2016/0336268 A1  11/2016  Kamikura et al.

FOREIGN PATENT DOCUMENTS

| | | |
|---|---|---|
| JP | 2012-159935 A | 8/2012 |
| JP | 2013-042054 A | 2/2013 |
| JP | 2015-211105 A | 11/2015 |
| WO | 2015/133024 A1 | 9/2015 |

* cited by examiner

SEMICONDUCTOR DEVICE

BACKGROUND OF THE INVENTION

1. Field of the Invention

The present disclosure relates to a semiconductor device.

2. Description of the Background Art

In a device for performing power conversion, or the like, a semiconductor module having therein a semiconductor element for performing switching is used. One of such semiconductor modules used therefor is formed by integrally molding a plate-shaped semiconductor element and a heat dissipation plate placed so as to thermally contact with a one-side surface of the semiconductor element, with mold resin. In the semiconductor module having the heat dissipation plate, the heat dissipation plate thermally contacting with the semiconductor element is exposed from a surface of the mold resin, in order to dissipate heat generated in the semiconductor element. However, heat dissipation from only the one-side surface of the semiconductor element might be insufficient for cooling the semiconductor element. Accordingly, for the purpose of improving cooling performance for the semiconductor element, disclosed is a semiconductor module having a both-surface cooling structure in which a heat dissipation plate is placed so as to thermally contact with both of the front surface and the back surface of the semiconductor element, thus enabling the semiconductor element to be cooled from both surfaces of the semiconductor element (see, for example, Patent Document 1).

In addition, since electric charge is readily accumulated at an end of the semiconductor element, it is necessary to improve withstand voltage property for the surface of the semiconductor element. Accordingly, for the purpose of keeping stable withstand voltage property even when a high electric field is applied to a passivation film on the surface of the semiconductor element, a semiconductor device in which a passivation film on the surface of the semiconductor element is formed in a layered structure, is disclosed (see, for example, Patent Document 2).

Patent Document 1: Japanese Laid-Open Patent Publication No. 2009-212302

Patent Document 2: Japanese Laid-Open Patent Publication No. 2013-42054

In the structure of the semiconductor module in Patent Document 1, the semiconductor element can be cooled from both surfaces of the semiconductor element, whereby cooling performance for the semiconductor element can be improved. However, as compared to a one-surface cooling structure in which only one surface of the semiconductor element is cooled, the number of members composing the semiconductor module in the both-surface cooling structure is approximately doubled and therefore the number of components increases. Thus, there is a problem that the cost for the semiconductor module increases and the structure of the semiconductor module is complicated.

In the structure of the semiconductor device in Patent Document 2, since the passivation film on the surface of the semiconductor element is formed in a layered structure, withstand voltage property at a high-electric-field part and between electrodes in the semiconductor element can be improved. However, in the case where a conductor such as a wire is present near the semiconductor element, an electric field is concentrated between the semiconductor element and the conductor, so that partial discharge occurs, thus causing a problem that dielectric breakdown occurs at a surface part of the semiconductor element and the semiconductor element might be damaged.

SUMMARY OF THE INVENTION

Accordingly, an object of the present disclosure is to obtain a semiconductor device that, in a one-surface cooling structure in which a heat dissipation plate is placed on one surface of a semiconductor element, can improve cooling performance and prevent occurrence of partial discharge around the semiconductor element.

A semiconductor device according to the present disclosure includes: a semiconductor module including a plate-shaped semiconductor element, a conductor electrically connected to one surface of the semiconductor element, a heat dissipation plate of which one surface is thermally and electrically connected to another surface of the semiconductor element, a resin member sealing the semiconductor element, the conductor, and the heat dissipation plate, and an insulation heat dissipation member thermally connected to another surface of the heat dissipation plate exposed from the resin member; a heatsink thermally connected to the insulation heat dissipation member; and an electric field inhibiting plate including a plate-shaped thin part covering the one surface of the semiconductor element and opposed thereto so as to be separated therefrom, the thin part being sealed by the resin member, and a connection part extending from the thin part to the heatsink and thermally and electrically connected to the heatsink.

The semiconductor device according to the present disclosure includes the semiconductor module including the heat dissipation plate of which one surface is thermally and electrically connected to the other surface of the semiconductor element, and the electric field inhibiting plate including the plate-shaped thin part which covers the one surface of the semiconductor element and is opposed thereto so as to be separated therefrom and which is sealed by the sealing material, and the connection part extending from the thin part to the heatsink and thermally and electrically connected to the heatsink. Thus, heat generated from the one surface side of the semiconductor element can be efficiently dissipated to the heatsink, and a local high electric field on a guard ring of the semiconductor element is introduced to the grounded electric field inhibiting plate, whereby generation of a high electric field can be inhibited. Thus, in the one-surface cooling structure in which the heat dissipation plate is provided on one surface of the semiconductor element, the cooling performance can be improved and occurrence of partial discharge at the periphery of the semiconductor element can be prevented.

DETAILED DESCRIPTION OF THE PREFERRED EMBODIMENTS OF THE INVENTION

Figure 1:
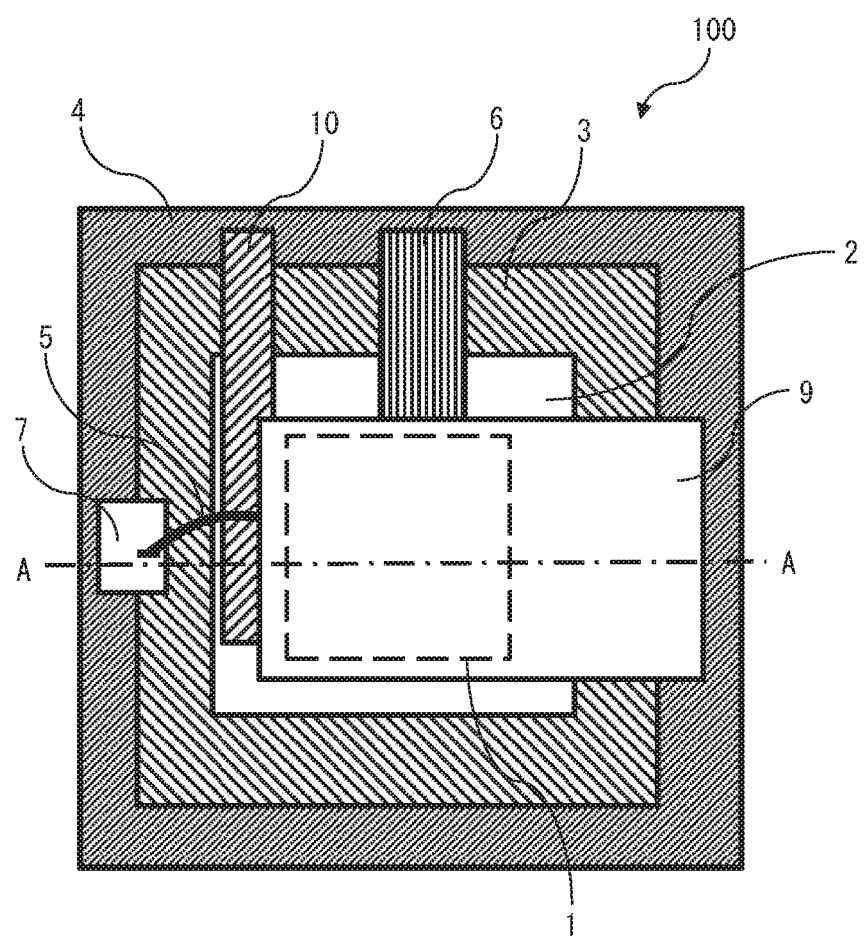
FIG. 1 is a top view schematically showing the structure of a semiconductor device according to the first embodiment of the present disclosure.

Hereinafter, a semiconductor device according to embodiments of the present disclosure will be described with reference to the drawings. In the drawings, the same or corresponding members or parts are denoted by the same reference characters.

First Embodiment

Figure 2:
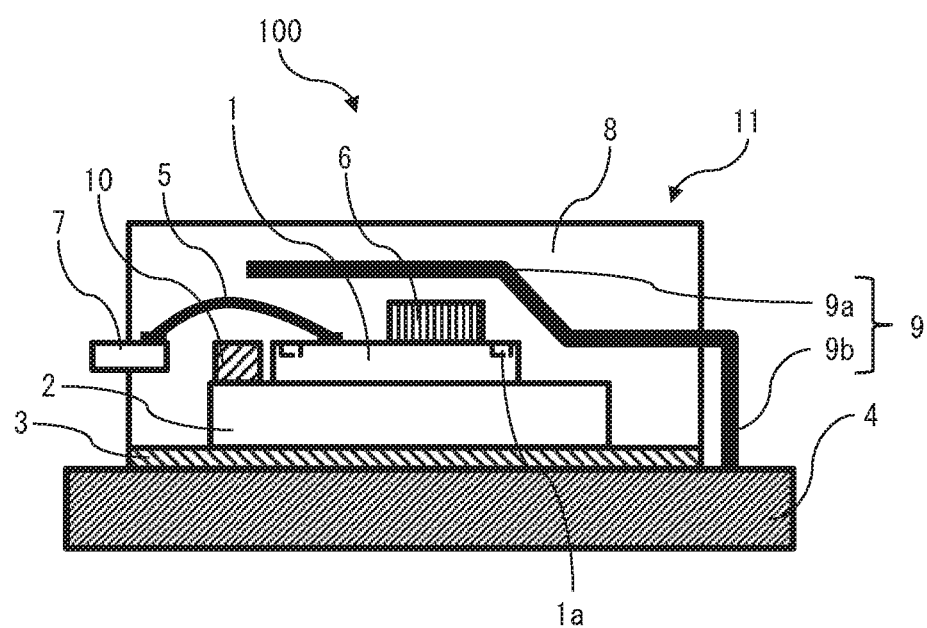
FIG. 2 is a major part sectional view of the semiconductor device cut at A-A sectional plane position in FIG. 1.

FIG. 1 is a top view schematically showing the structure of a semiconductor device 100 according to the first embodiment of the present disclosure, and FIG. 2 is a major part sectional view of the semiconductor device 100 cut at A-A sectional plane position in FIG. 1. FIG. 1 is a view shown in a state in which a sealing material 8 is removed, and a broken line indicates the outer shape of a semiconductor element 1 covered by an electric field inhibiting plate 9. The semiconductor device 100 includes a semiconductor module 11 having the semiconductor element 1 therein, a heatsink 4 thermally connected to an insulation heat dissipation member 3 provided to the semiconductor module 11, and the electric field inhibiting plate 9, and is used for a device for performing power conversion, or the like.

<Semiconductor Module 11>

As shown in FIG. 2, the semiconductor module 11 includes: the semiconductor element 1 having a plate shape; a first lead frame 6 which is a conductor electrically connected to one surface of the semiconductor element 1; a heat dissipation plate 2 of which one surface is thermally and electrically connected to another surface of the semiconductor element 1; a second lead frame 10 which is a conductor electrically connected to the one surface of the heat dissipation plate 2; the sealing material 8 which is a resin member for sealing the semiconductor element 1, the first lead frame 6, the second lead frame 10, and the heat dissipation plate 2; and the insulation heat dissipation member 3 thermally connected to another surface of the heat dissipation plate 2 exposed from the sealing material 8. In addition, the semiconductor module 11 has a control terminal 7 partially exposed from the sealing material 8. The control terminal 7 is electrically connected to a bonding pad (not shown) of the semiconductor element 1 via a wire conductor 5 which is a conductor electrically connected to the one surface of the semiconductor element 1.

As the semiconductor element 1, a power control semiconductor element such as a metal oxide semiconductor field effect transistor (MOSFET) or an insulated gate bipolar transistor (IGBT), a flyback diode, or the like is used. For the semiconductor element 1 in the present embodiment, a power MOSFET having a diode therein is used as an example. In addition, for the semiconductor element 1, a semiconductor element made from a material such as silicon carbide, silicon, or gallium nitride is used. In the case where the semiconductor module 11 has the semiconductor element 1 made from silicon carbide, the semiconductor element 1 is to operate under a higher-electric-field condition as compared to a semiconductor element made from silicon. Therefore, an effect of inhibiting generation of a high electric field as described later can be obtained more effectively. The semiconductor element 1 and the heat dissipation plate 2 are joined to each other using a sintered material (not shown) containing silver as a main component, whereby the semiconductor element 1 and the heat dissipation plate 2 are thermally and electrically connected to each other. The joining between the semiconductor element 1 and the heat dissipation plate 2 may be made by solder bonding, diffusion bonding, or the like. The semiconductor element 1 has a guard ring 1a provided along the outer periphery of the one surface, in order to keep withstand voltage property in a direction parallel to the surface.

The heat dissipation plate 2 is made from metal such as copper or aluminum which is high in thermal conductivity and is electrically conductive. The heat dissipation plate 2 is thermally connected to the heatsink 4 via the insulation heat dissipation member 3. The insulation heat dissipation member 3 is made of an insulating material which is thermally conductive, and effectively transfers heat generated in the semiconductor element 1, to the heatsink 4. Therefore, heat generated in the semiconductor element 1 is dissipated toward the heatsink 4 via the heat dissipation plate 2 and the insulation heat dissipation member 3, whereby the semiconductor element 1 is effectively cooled. The heatsink 4 is formed from metal having a high thermal conductivity, e.g., aluminum, and may have therein a flow path through which a coolant flows.

The first lead frame 6 is electrically connected to the one surface of the semiconductor element 1 by solder bonding or the like. The second lead frame 10 is electrically connected to the one surface of the heat dissipation plate 2 by solder bonding or the like. The first lead frame 6 and the second lead frame 10 are made from a material such as copper which is high in electric conductivity. Current flowing between the drain and the source provided at the one surface and the other surface of the semiconductor element 1 flows in both directions via the heat dissipation plate 2 between the first lead frame 6 and the second lead frame 10.

The wire conductor 5 connecting the control terminal 7 and a gate provided by a bonding pad on the one surface of the semiconductor element 1 is a wire made from aluminum, for example. The wire conductor is not limited to an aluminum wire. Instead of an aluminum wire, a metal wire made of gold, copper, or the like, an aluminum ribbon, a copper clip, or the like may be used. An aluminum ribbon and a copper clip have larger sectional areas as compared to an aluminum wire, and therefore have smaller wire resistance. Therefore, using an aluminum ribbon or a copper clip as the wire conductor can reduce power loss in the semiconductor element 1.

The sealing material 8 is thermosetting resin such as epoxy, for example. The sealing material 8 covers the semiconductor element 1, the first lead frame 6, the control terminal 7, the wire conductor 5, the second lead frame 10, and the heat dissipation plate 2, and integrates these. In addition, the sealing material 8 protects the semiconductor element 1 from the outside environment. A molding method for the sealing material 8 is, for example, transfer molding. However, without limitation thereto, the molding method may be direct potting. Parts of the first lead frame 6, the control terminal 7, and the second lead frame 10 are exposed from the sealing material 8 and are connected as mounting terminals of the semiconductor device 100 to a circuit of an inverter control device or the like.

<Electric Field Inhibiting Plate 9>

The structure of the electric field inhibiting plate 9 which is a major part of the present disclosure will be described. As shown in FIG. 2, the electric field inhibiting plate 9 includes a plate-shaped thin part 9a and a connection part 9b. The thin part 9a covers the one surface of the semiconductor element 1 so as to include an area where a high electric field is locally generated on the guard ring 1a, and is opposed to the semiconductor element 1 so as to be separated therefrom, and the thin part 9a is sealed by the sealing material 8. The connection part 9b extends from the thin part 9a to the heatsink 4 side and is thermally and electrically connected to the heatsink 4. Since the heatsink 4 is grounded, the electric field inhibiting plate 9 electrically connected to the heatsink 4 is also at a grounded potential. The connection part 9b of the electric field inhibiting plate 9 is connected to the heatsink 4 at the outside of the semiconductor module 11. Since the connection part 9b is connected to the heatsink 4 at the outside of the semiconductor module 11, the connection between the connection part 9b and the heatsink 4 can be made by screwing, for example. Using screwing for the connection between the connection part 9b and the heatsink 4 facilitates the manufacturing process, whereby productivity of the semiconductor device 100 can be improved. It is noted that the distance between the one surface of the semiconductor element 1 and the thin part 9a of the electric field inhibiting plate 9 is 1 mm or less, for example.

The electric field inhibiting plate 9 is made from an electrically conductive material, which is metal such as copper or aluminum. The material of the electric field inhibiting plate 9 is not limited to metal, but may be electrically conductive plastic obtained by containing carbon in epoxy resin. In the case where the electric field inhibiting plate 9 is made from electrically conductive plastic, the difference between the linear expansion coefficients of the electric field inhibiting plate 9 and the sealing material 8 becomes smaller than that in the case where the electric field inhibiting plate 9 is made from metal. If the difference between the linear expansion coefficients of the electric field inhibiting plate 9 and the sealing material 8 is small, peeling between the electric field inhibiting plate 9 and the sealing material 8 due to the difference in linear expansion coefficient is inhibited. If peeling between the electric field inhibiting plate 9 and the sealing material 8 is inhibited, occurrence of partial discharge due to a peeled part can be inhibited.

On the guard ring 1a provided for keeping withstand voltage property in a direction parallel to the surface of the semiconductor element 1, a high electric field is locally generated. The above structure introduces a high electric field that can be locally generated, to the grounded electric field inhibiting plate 9, whereby generation of a high electric field can be inhibited. Since generation of a high electric field is inhibited, occurrence of partial discharge due to a high electric field can be prevented. In addition, setting the distance between the one surface of the semiconductor element 1 and the thin part 9a to 1 mm or less can improve the effect of inhibiting generation of a high electric field. In addition, when high voltage is applied to the first lead frame 6, electric charge injection into the semiconductor element 1 occurs by field electron emission. By introducing this electric charge to the electric field inhibiting plate 9, it is possible to prevent reduction in withstand voltage property of the semiconductor element 1. At the same time, the electric field inhibiting plate 9 can block electromagnetic noise generated from the semiconductor element 1.

In addition, since the electric field inhibiting plate 9 has a higher thermal conductivity than the sealing material 8, heat generated from the one surface side of the semiconductor element 1 can be efficiently dissipated via the electric field inhibiting plate 9 to the heatsink 4. Owing to this heat dissipation, thermal resistance inside the semiconductor module 11 is reduced, whereby cooling performance for the semiconductor element 1 can be improved. In addition, since the cooling performance for the semiconductor element 1 is improved and the guard ring 1a is reduced owing to relaxation of an electric field as a result of inhibition of generation of a high electric field, the size of the semiconductor element 1 can be reduced. Since the size of the semiconductor element 1 can be reduced, the cost for the semiconductor element 1 can be reduced.

As described above, the semiconductor device 100 according to the first embodiment includes the semiconductor module 11 including the heat dissipation plate 2 of which one surface is thermally and electrically connected to the other surface of the semiconductor element 1, and the electric field inhibiting plate 9 including the plate-shaped thin part 9a which covers the one surface of the semiconductor element 1 and is opposed thereto so as to be separated therefrom and which is sealed by the sealing material 8, and the connection part 9b extending from the thin part 9a to the heatsink 4 and thermally and electrically connected to the heatsink 4. Thus, heat generated from the one surface side of the semiconductor element 1 can be efficiently dissipated to the heatsink 4, and a local high electric field on the guard ring 1a of the semiconductor element 1 is introduced to the grounded electric field inhibiting plate 9, whereby generation of a high electric field can be inhibited. Thus, in the one-surface cooling structure in which the heat dissipation plate 2 is provided on the other surface of the semiconductor element 1, the cooling performance can be improved and occurrence of partial discharge at the periphery of the semiconductor element 1 can be prevented. In addition, it is possible to improve the cooling performance in the one-surface cooling structure merely by adding the electric field inhibiting plate 9, without increasing the number of components as in a conventional both-surface cooling structure.

In addition, in the case where the connection part 9b of the electric field inhibiting plate 9 is connected to the heatsink 4 at the outside of the semiconductor module 11, it is possible to use screwing for the connection between the connection part 9b and the heatsink 4. Thus, the manufacturing processing is facilitated, whereby productivity of the semiconductor device 100 can be improved. In addition, in the case where the semiconductor device 100 includes the electric field inhibiting plate 9 made from electrically conductive plastic, the linear expansion coefficients of the electric field inhibiting plate 9 and the sealing material 8 become close to each other. Thus, peeling between the electric field inhibiting plate 9 and the sealing material 8 due to the difference in linear expansion coefficient is inhibited, whereby occurrence of partial discharge due to a peeled part can be inhibited.

In addition, in the case where the distance between the one surface of the semiconductor element 1 and the thin part 9a of the electric field inhibiting plate 9 is 1 mm or less, the effect of inhibiting generation of a high electric field can be improved. In the case where the semiconductor device 100 includes the semiconductor element 1 made from silicon carbide, the semiconductor element 1 is to operate under a higher-electric-field condition than a semiconductor element made from silicon. Therefore, the effect of inhibiting generation of a high electric field can be more effectively obtained.

Second Embodiment

Figure 3:
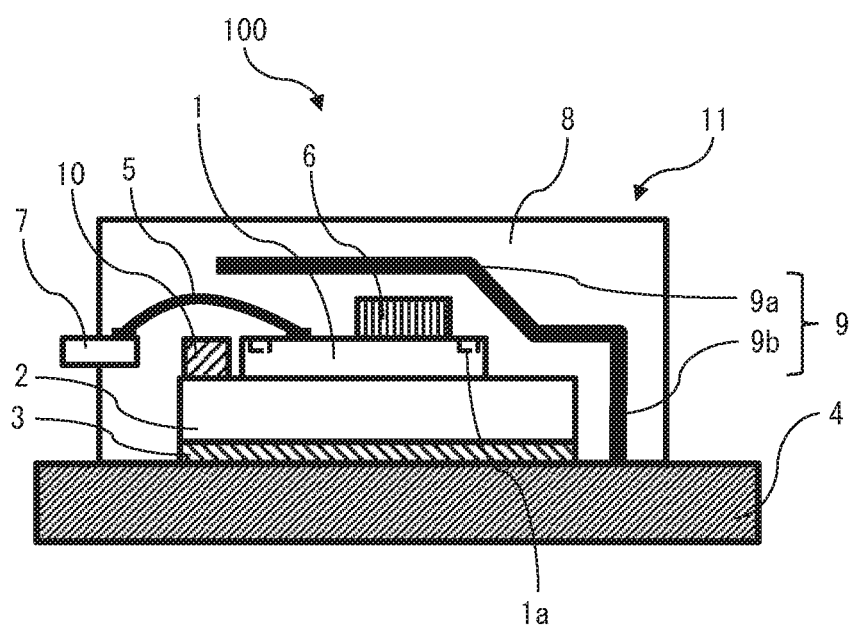
FIG. 3 is a sectional view schematically showing the structure of a semiconductor device according to the second embodiment of the present disclosure.

A semiconductor device 100 according to the second embodiment of the present disclosure will be described. FIG. 3 is a sectional view schematically showing the structure of the semiconductor device 100 according to the second embodiment. FIG. 3 is a major part sectional view of the semiconductor device 100 cut at a position equivalent to A-A sectional plane position in FIG. 1. The semiconductor device 100 according to the second embodiment is different from the first embodiment in the part where the connection part 9b and the heatsink 4 are connected to each other.

The connection part 9b of the electric field inhibiting plate 9 is connected to the heatsink 4 at the inside of the semiconductor module 11. Therefore, the connection part 9b of the electric field inhibiting plate 9 is also sealed by the sealing material 8 together with the thin part 9a. The electric field inhibiting plate 9 is connected to the heatsink 4 by fitting an end of the connection part 9b to a hole (not shown) provided in the surface of the heatsink 4, for example. In order to connect the connection part 9b to the heatsink 4 at the inside of the semiconductor module 11, the size of the outer shape of the insulation heat dissipation member 3 is reduced so as to be equivalent to the size of the outer shape of the heat dissipation plate 2. The insulation heat dissipation member 3 is an insulating sheet formed so as to cover the other surface of the heat dissipation plate 2, for example. However, without limitation thereto, the insulation heat dissipation member 3 may be a DBC substrate integrated with the heat dissipation plate 2.

As described above, in the semiconductor device 100 according to the second embodiment, the connection part 9b of the electric field inhibiting plate 9 is connected to the heatsink 4 at the inside of the semiconductor module 11. Thus, the entirety of the electric field inhibiting plate 9 is sealed by the sealing material 8 inside the semiconductor module 11. Therefore, the area of the electric field inhibiting plate 9 that absorbs heat inside the semiconductor module 11 is increased, whereby cooling performance for the semiconductor element 1 can be improved.

Third Embodiment

Figure 4A:
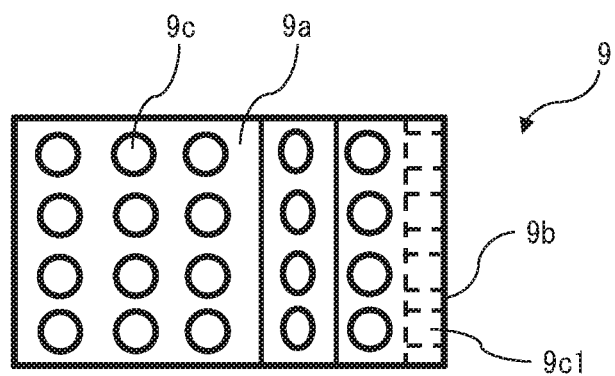
FIG. 4A and FIG. 4B are views schematically showing the structure of an electric field inhibiting plate of a semiconductor device according to the third embodiment of the present disclosure.
Figure 4B:
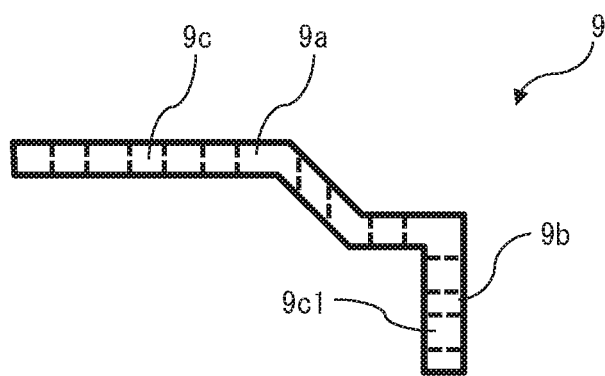

A semiconductor device 100 according to the third embodiment of the present disclosure will be described. FIG. 4A and FIG. 4B are views schematically showing the structure of the electric field inhibiting plate 9 of the semiconductor device 100 according to the third embodiment. FIG. 4A is a top view and FIG. 4B is a side view. In the semiconductor device 100 according to the third embodiment, the electric field inhibiting plate 9 has through holes 9c.

The electric field inhibiting plate 9 has the through holes 9c in the thin part 9a, of the electric field inhibiting plate 9, which is sealed by the sealing material 8. In FIG. 4A and FIG. 4B, a plurality of round through holes 9c are arranged at regular intervals in the thin part 9a. The positions, the size, the shape, and the number of the through holes 9c are not limited thereto. As long as a high electric field locally generated on the guard ring 1a can be inhibited with the thin part 9a, the positions, the size, the shape, and the number of the through holes 9c may be optionally set. Providing the through holes 9c allows the sealing material 8 to readily go into an area between the semiconductor element 1 and the thin part 9a when the semiconductor element 1 and the like are molded with the sealing material 8. Thus, generation of bubbles inside the semiconductor module 11 during molding can be inhibited. Since generation of bubbles is inhibited, partial discharge due to bubbles is less likely to occur, so that insulation property of the semiconductor device 100 can be improved. In addition, providing the through holes 9c can reduce the weight of the electric field inhibiting plate 9.

In the case where the electric field inhibiting plate 9 is formed from a metal plate, the through holes 9c are formed in the electric field inhibiting plate 9 by mechanical working, for example. The electric field inhibiting plate 9 may be formed by working a metal mesh material. In the case where the electric field inhibiting plate 9 is formed by using a metal mesh material, the mesh part forms the through holes 9c.

In the case where the connection part 9b of the electric field inhibiting plate 9 is connected to the heatsink 4 at the inside of the semiconductor module 11 as described in the second embodiment, through holes 9c1 are provided also in the connection part 9b, of the electric field inhibiting plate 9, which is sealed by the sealing material 8. Providing the through holes 9c1 in the connection part 9b allows the sealing material 8 to readily go into an area between the connection part 9b, and the semiconductor element 1 and the heat dissipation plate 2, when the semiconductor element 1 and the like are molded with the sealing material 8. Thus, generation of bubbles inside the semiconductor module 11 during molding can be inhibited. Since generation of bubbles is inhibited, partial discharge due to bubbles is less likely to occur, so that insulation property of the semiconductor device 100 can be improved.

As described above, in the semiconductor device 100 according to the third embodiment, the electric field inhibiting plate 9 has the through holes 9c in the thin part 9a, of the electric field inhibiting plate 9, which is sealed by the sealing material 8. Thus, generation of bubbles inside the semiconductor module 11 during molding can be inhibited, whereby partial discharge due to bubbles can be inhibited. In addition, since partial discharge is inhibited, insulation property of the semiconductor device 100 can be improved. In addition, the weight of the electric field inhibiting plate 9 can be reduced, whereby the weight of the semiconductor device 100 can be reduced.

Fourth Embodiment

Figure 5A:
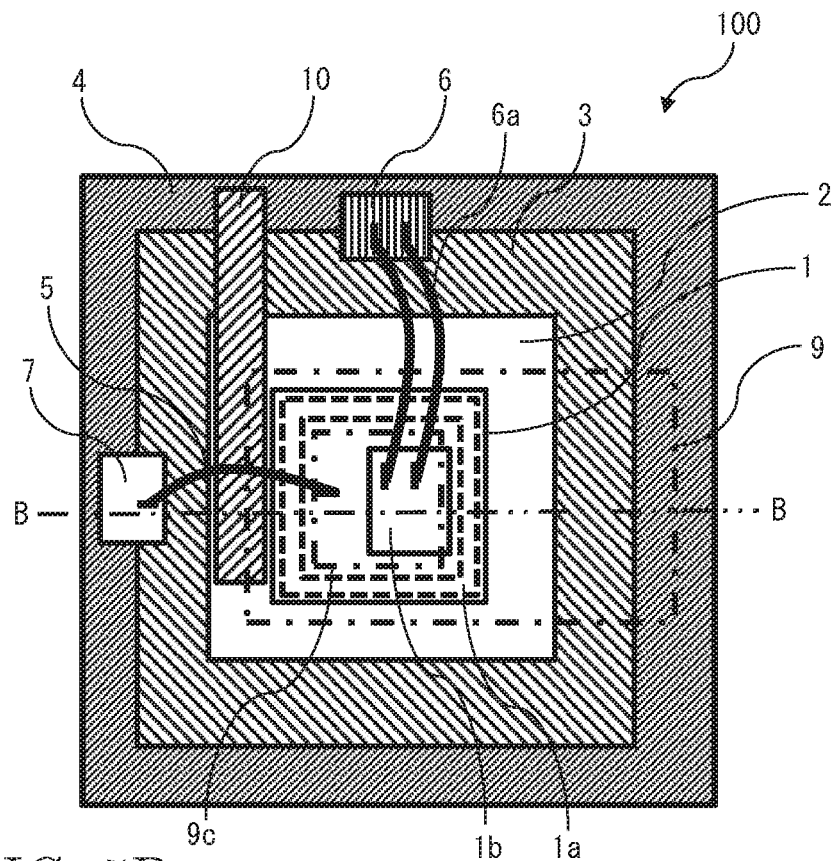
FIG. 5A and FIG. 5B are views schematically showing the structure of a semiconductor device according to the fourth embodiment of the present disclosure.
Figure 5B:
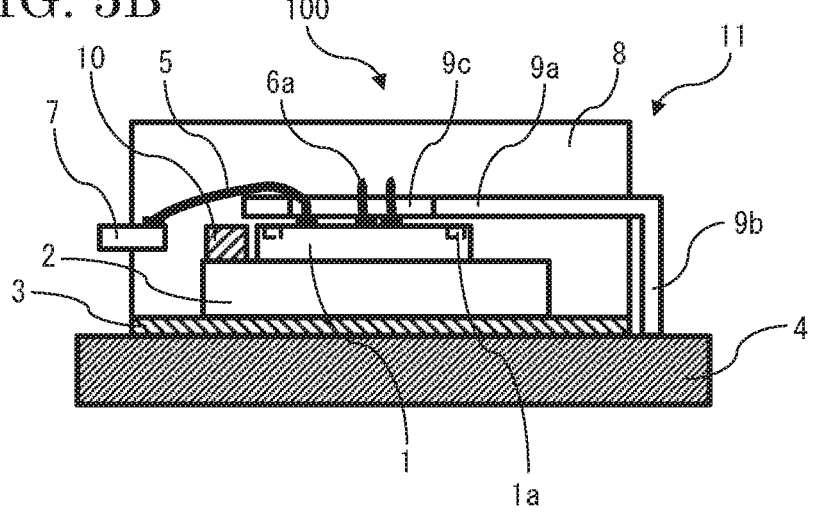
Figure 6A:
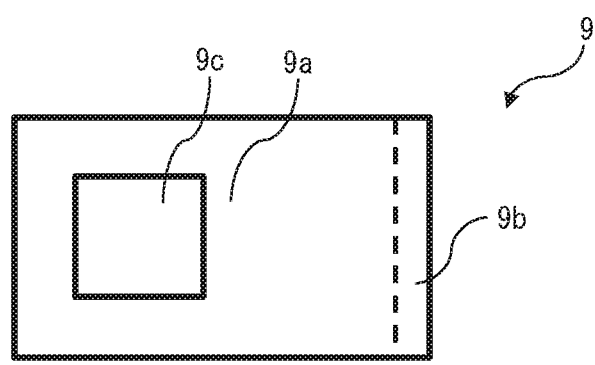
FIG. 6A and FIG. 6B are views schematically showing the structure of an electric field inhibiting plate of a semiconductor device according to the fourth embodiment of the present disclosure.
Figure 6B:
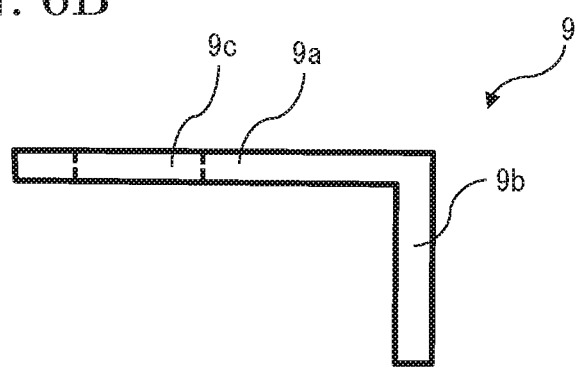

A semiconductor device 100 according to the fourth embodiment will be described. FIG. 5A and FIG. 5B are views schematically showing the structure of the semiconductor device 100 according to the fourth embodiment. FIG. 5A is a top view and FIG. 5B is a sectional view cut at B-B sectional plane position in FIG. 5A. FIG. 6A and FIG. 6B are views schematically showing the structure of the electric field inhibiting plate 9 of the semiconductor device 100. FIG. 6A is a top view and FIG. 6B is a side view. FIG. 5A is a view shown in a state in which the sealing material 8 is removed, and for the electric field inhibiting plate 9, only the outer shape is indicated by a dotted-dashed line. The semiconductor device 100 according to the fourth embodiment is different from the first embodiment in the structure of connection between the semiconductor element 1, and the wire conductor 5 and the first lead frame 6.

Wire conductors 6a which are conductors electrically connected to a bonding pad 1b provided on the one surface of the semiconductor element 1 extend through the through hole 9c provided in the thin part 9a of the electric field inhibiting plate 9. The semiconductor module 11 has the first lead frame 6 partially exposed from the sealing material 8. The first lead frame 6 is electrically connected via the wire conductors 6a to the bonding pad 1b provided on the one surface of the semiconductor element 1. Here, two wire conductors 6a connecting the first lead frame 6 and the bonding pad 1b are provided. However, the number of wire conductors 6a are not limited thereto, and may be changed in accordance with the magnitude of current flowing through the first lead frame 6, or the like. For the wire conductors 6a, as with the wire conductor 5, an aluminum wire, a metal wire made of gold, copper, or the like, an aluminum ribbon, a copper clip, or the like is used.

The wire conductor 5 which is a conductor electrically connected to the bonding pad (not shown) provided on the one surface of the semiconductor element 1 extends through the through hole 9c provided in the thin part 9a of the electric field inhibiting plate 9. The semiconductor module 11 has the control terminal 7 partially exposed from the sealing material 8. The control terminal 7 is electrically connected via the wire conductor 5 to the bonding pad (not shown) provided on the one surface of the semiconductor element 1.

Since the wire conductor 5 and the wire conductors 6a extend through the through hole 9c provided in the thin part 9a, the electric field inhibiting plate 9 is placed between the semiconductor element 1, and the wire conductor 5 and the wire conductors 6a. This placement of the electric field inhibiting plate 9 can shorten the distance between the thin part 9a of the electric field inhibiting plate 9 and the one surface of the semiconductor element 1. Since the distance between the thin part 9a and the one surface of the semiconductor element 1 is shortened, the effect of inhibiting generation of a high electric field can be improved. In addition, since the electric field inhibiting plate 9 is provided at the lower side of the wire conductor 5 and the wire conductors 6a, concentration of an electric field on the wire conductor 5 and the wire conductors 6a can be relaxed. In addition, when high voltage is applied to the wire conductor 6a, electric charge injection into the semiconductor element 1 occurs by field electron emission. By introducing this electric charge to the electric field inhibiting plate 9, it is possible to inhibit electric charge injection into the semiconductor element 1 due to field electron emission, whereby insulation property of the semiconductor element 1 can be improved.

The wire conductor 5 and the wire conductors 6a extend through one through hole 9c provided in the thin part 9a. However, another structure may be adopted. A plurality of through holes 9c may be provided in the thin part 9a, and the wire conductor 5 and the wire conductors 6a may pass through different through holes 9c. If the plurality of through holes 9c are provided and the size of each through hole 9c is reduced, the distance between the electric field inhibiting plate 9, and the wire conductor 5 and the wire conductors 6a, is shortened, whereby concentration of an electric field on the wire conductor 5 and the wire conductors 6a can be further relaxed.

As described above, in the semiconductor device 100 according to the fourth embodiment, the wire conductor 5 and the wire conductors 6a extend through the through hole 9c provided in the thin part 9a. Thus, the distance between the thin part 9a of the electric field inhibiting plate 9 and the one surface of the semiconductor element 1 can be shortened, whereby the effect of inhibiting generation of a high electric field can be improved. In addition, since the electric field inhibiting plate 9 is provided at the lower side of the wire conductor 5 and the wire conductors 6a, concentration of an electric field on the wire conductor 5 and the wire conductors 6a can be relaxed.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

DESCRIPTION OF THE REFERENCE CHARACTERS 1 semiconductor element
1a guard ring
1b bonding pad
2 heat dissipation plate
3 insulation heat dissipation member
4 heatsink
5 wire conductor
6 first lead frame
6a wire conductor
7 control terminal
8 sealing material
9 electric field inhibiting plate
9a thin part
9b connection part
9c through hole
9c1 through hole
10 second lead frame
11 semiconductor module
100 semiconductor device

What is claimed is:
1. A semiconductor device comprising:
a semiconductor module including
a plate-shaped semiconductor element,
a conductor electrically connected to one surface of the semiconductor element,
a heat dissipation plate of which one surface is thermally and electrically connected to another surface of the semiconductor element,
a resin member sealing the semiconductor element, the conductor, and the heat dissipation plate, and
an insulation heat dissipation member thermally connected to another surface of the heat dissipation plate exposed from the resin member;
a heatsink thermally connected to the insulation heat dissipation member; and
an electric field inhibiting plate including
a plate-shaped thin part covering the one surface of the semiconductor element and opposed thereto so as to be separated therefrom, the thin part being sealed by the resin member, and
a connection part extending from the thin part to the heatsink and thermally and electrically connected to the heatsink.

2. The semiconductor device according to claim 1, wherein
   the connection part of the electric field inhibiting plate is connected to the heatsink at an outside of the semiconductor module.

3. The semiconductor device according to claim 1, wherein
   the connection part of the electric field inhibiting plate is connected to the heatsink at an inside of the semiconductor module.

4. The semiconductor device according to claim 1, wherein
   the electric field inhibiting plate has a through hole in the thin part of the electric field inhibiting plate.

5. The semiconductor device according to claim 4, wherein
   the conductor extends through the through hole.

6. The semiconductor device according to claim 1, wherein
   the electric field inhibiting plate is made from electrically conductive plastic.

7. The semiconductor device according to claim 1, wherein
   a distance between the one surface of the semiconductor element and the thin part of the electric field inhibiting plate is 1 mm or less.

8. The semiconductor device according to claim 1, wherein
   the semiconductor element is made from silicon carbide.

* * * * *